(12) United States Patent
Lee et al.

(10) Patent No.: US 9,105,870 B2
(45) Date of Patent: Aug. 11, 2015

(54) ORGANIC LIGHT-EMITTING APPARATUS AND METHOD OF MANUFACTURING THE SAME

(75) Inventors: Ah-Ram Lee, Yongin (KR); Kwan-Young Han, Yongin (KR); Ho-Moon Kang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1054 days.

(21) Appl. No.: 13/155,296

(22) Filed: Jun. 7, 2011

(65) Prior Publication Data

US 2012/0007137 A1 Jan. 12, 2012

(30) Foreign Application Priority Data

Jul. 12, 2010 (KR) .................. 10-2010-0066997

(51) Int. Cl.
*H01L 33/00* (2010.01)
*H01L 51/52* (2006.01)
*H01L 51/00* (2006.01)

(52) U.S. Cl.
CPC ......... *H01L 51/5246* (2013.01); *H01L 51/0054* (2013.01); *H01L 51/0058* (2013.01); *H01L 51/0067* (2013.01); *H01L 51/0072* (2013.01); *H01L 51/0085* (2013.01); *H01L 51/0087* (2013.01); *H01L 2251/308* (2013.01)

(58) Field of Classification Search
CPC ............ H01L 51/5246; H01L 51/0054; H01L 51/0058; H01L 51/0067; H01L 51/0072; H01L 51/0085; H01L 51/0087; H01L 2251/308

USPC .................. 257/40, 100, E51.018; 438/26, 99
See application file for complete search history.

(56) References Cited

U.S. PATENT DOCUMENTS

| | | | |
|---|---|---|---|
| 5,990,615 A | 11/1999 | Sakaguchi et al. | |
| 7,145,290 B2* | 12/2006 | Kang | 313/512 |
| 7,759,864 B2* | 7/2010 | Lee et al. | 313/512 |
| 2002/0043933 A1 | 4/2002 | Ooishi et al. | |
| 2004/0178727 A1 | 9/2004 | Song et al. | |
| 2005/0116245 A1* | 6/2005 | Aitken et al. | 257/99 |
| 2009/0015149 A1 | 1/2009 | Lee et al. | |
| 2009/0109388 A1 | 4/2009 | Takahashi et al. | |
| 2010/0079065 A1 | 4/2010 | Kamiura | |

FOREIGN PATENT DOCUMENTS

| | | |
|---|---|---|
| JP | 2003-217832 A | 7/2003 |
| JP | 2004-327402 A | 11/2004 |
| JP | 2005-071639 A | 3/2005 |
| JP | 2005-078906 A | 3/2005 |
| JP | 2005-243376 A | 9/2005 |
| JP | 2006-202650 A | 8/2006 |

(Continued)

OTHER PUBLICATIONS

Official Action issued by the Korean Industrial Property Office dated Feb. 27, 2012 in Korean Patent Application No. 10-2010-0066997, 4 pages.

(Continued)

*Primary Examiner* — Su C Kim
*Assistant Examiner* — Colleen E Snow
(74) *Attorney, Agent, or Firm* — Knobbe Martens Olson & Bear LLP

(57) ABSTRACT

An organic light-emitting apparatus and a method of manufacturing the same are provided.

28 Claims, 7 Drawing Sheets

(56) References Cited

FOREIGN PATENT DOCUMENTS

| | | | |
|---|---|---|---|
| JP | 2007-284472 A | 11/2007 |
| JP | 2008-016300 A | 1/2008 |
| JP | 2008-218206 A | 9/2008 |
| JP | 2009-163081 A | 7/2009 |
| JP | 2010-121144 A | 6/2010 |
| KR | 1998-071030 | 10/1998 |
| KR | 10-0269391 B1 | 7/2000 |
| KR | 1020040078774 A | 9/2004 |
| KR | 10-0522689 B1 | 10/2005 |
| KR | 10-2006-0011831 A | 2/2006 |
| KR | 1020060023652 A | 3/2006 |
| KR | 1020060084743 A | 7/2006 |
| KR | 10-0730225 B1 | 6/2007 |
| KR | 1020060084978 A | 7/2008 |
| KR | 1020090011656 A | 2/2009 |
| KR | 10-0940086 B1 | 1/2010 |
| TW | 200724605 A | 7/2007 |
| TW | 200925745 A | 6/2009 |
| WO | WO 2009/139292 A1 | 11/2009 |

OTHER PUBLICATIONS

Extended European Search Report issued by the European Patent Office on Apr. 29, 2013, in connection with the corresponding European Patent Application No. 11173649.2.

Registration Determination Certificate issued by the Korean Intellectual Property Office dated Sep. 18, 2012, 5 pages.

Office Action issued Jan. 26, 2015, in connection with corresponding Taiwan Application No. 100124507.

Office Action mailed Apr. 21, 2015, in corresponding Japanese Patent Application No. 2011-154242.

\* cited by examiner

ORGANIC LIGHT-EMITTING APPARATUS AND METHOD OF MANUFACTURING THE SAME

CROSS-REFERENCE TO RELATED APPLICATIONS

This application claims the benefit of Korean Patent Application No. 10-2010-0066997, filed on Jul. 12, 2010, in the Korean Intellectual Property Office, the disclosure of which is incorporated herein in its entirety by reference.

BACKGROUND

1. Field

An organic light-emitting apparatus and a method of manufacturing the same are provided.

2. Description of the Related Technology

Organic light-emitting devices, which are self-emitting devices, have advantages such as a wide viewing angle, excellent contrast, quick response, high brightness, and excellent driving voltage characteristics, and may provide multicolor images.

In general, an organic light-emitting device may include an anode, a cathode, and an organic layer disposed between the anode and the cathode. The organic layer may include a hole transport layer (HTL), an emission layer (EML), an electron transport layer (ETL), and a cathode. When a voltage is applied between the anode and the cathode, holes injected from the anode move to the EML via the HTL, and electrons injected from the cathode move to the EML via the ETL. Carriers such as the holes and electrons recombine in the EML to generate excitons. When the excitons drop from an excited state to a ground state, light is emitted. An organic light-emitting apparatus including the organic light-emitting device may further include a driving transistor or a switching transistor.

Since the organic light-emitting device may deteriorate due to oxygen and/or moisture, a sealing unit for effectively sealing the organic light-emitting device is required in order to realize a high quality organic light-emitting apparatus.

SUMMARY OF CERTAIN INVENTIVE ASPECTS

An organic light-emitting apparatus having a structure for preventing oxygen and/or moisture permeation is provided.

A method of manufacturing the organic light-emitting apparatus is also provided.

According to an aspect of the present embodiments, there is provided an organic light-emitting apparatus including: a device substrate including a light-emitting area and a non-emitting area; an encapsulation substrate covering the light-emitting area; a first electrode formed on the light-emitting area and disposed between the device substrate and the encapsulation substrate; an organic layer disposed between the encapsulation substrate and the first electrode; a second electrode disposed between the organic layer and the encapsulation substrate; a sealing member surrounding the light-emitting area; and a third electrode disposed on the non-emitting area outside the sealing member, including a first portion surrounding the sealing member, and comprising a same material as that of the first electrode.

Each of the first electrode and the third electrode may include at least one material selected from the group consisting of metals and conductive oxides.

Each of the first electrode and the third electrode may comprise indium tin oxide (ITO).

The sealing member may include at least one of an adhesive and glass frit.

The sealing member may include at least one of a silicon-based compound represented by Formula 1 and a cured product of the silicon-based compound:

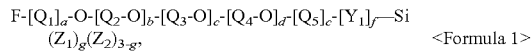  <Formula 1>

$$F\text{-}[Q_1]_a\text{-}O\text{-}[Q_2\text{-}O]_b\text{-}[Q_3\text{-}O]_c\text{-}[Q_4\text{-}O]_d\text{-}[Q_5]_e\text{-}[Y_1]_f\text{—}Si(Z_1)_g(Z_2)_{3-g},$$

Where $Q_1$ is a divalent group represented by —$C(R_1)(R_2)$—; $Q_2$ is a divalent group represented by —$C(R_3)(R_4)$—$C(R_5)(R_6)$—$C(R_7)(R_8)$—; $Q_3$ is a divalent group represented by —$C(R_9)(R_{10})$—$C(R_{11})(R_{12})$—; $Q_4$ is a divalent group represented by —$C(R_{13})(R_{14})$—; $Q_5$ is a divalent group represented by —$C(R_{15})(R_{16})$—; $R_1$ through $R_{16}$ are each independently selected from the group consisting of H, —F, —$CH_3$, —$CH_2F$, —$CHF_2$, and —$CF_3$; $Y_1$ is a divalent organic group; $Z_1$ is a $C_1$-$C_{30}$ alkyl group or a $C_1$-$C_{30}$ alkyl group that is substituted with at least one —F; $Z_2$ is a $C_1$-$C_{30}$ alkoxy group or a $C_1$-$C_{30}$ alkoxy group that is substituted with at least one —F; a and e are each independently an integer from 1 to 20; b, c, and d are each independently an integer from 0 to 200, and a case where b, c, and d are all 0 is excluded; f is an integer from 0 to 10; and g is an integer from 0 to 3.

The sealing member may sequentially include a first sealing member layer, a second sealing member layer, and a third sealing member layer, each of the first sealing member layer and the third sealing member layer may include an adhesive, and the second sealing member layer may include at least one of the silicon-based compound represented by Formula 1 and the cured product of the silicon-based compound;

A side surface of the sealing member and a side surface of the first portion of the third electrode may contact each other.

When a maximum thickness of the first electrode is $L_1$ and a maximum thickness of the first portion of the third electrode is $L_2$, $L_1=L_2$.

When a maximum thickness of the first portion of the third electrode is $L_2$ and a maximum thickness of the sealing member is $L_3$, $L_2 \geq L_3$.

A space between the device substrate and the encapsulation substrate may be a vacuum space.

The organic light-emitting apparatus may further include a moisture-absorbing layer disposed in a space between the device substrate and the encapsulation substrate.

A filler may fill a space between the device substrate and the encapsulation substrate The filler may include at least one of the silicon-based compound represented by Formula 1 and the cured product of the silicon-based compound.

The sealing member and the first portion of the third electrode may be spaced apart from each other, a space between the sealing member and the first portion of the third electrode may be filled with a first layer, and the first layer may include at least one of the silicon-based compound represented by Formula 1 and the cured product of the silicon-based compound.

When a maximum thickness of the first portion of the sealing member is $L_3$ and a maximum thickness of the first layer is $L_4$, $L_3 \leq L_4$.

The third electrode may have a second portion extending from the first portion of the third electrode toward the sealing member, and the second portion of the third electrode may be located between the sealing member and the device substrate.

When a maximum thickness of the third electrode is $L_2$ and a maximum thickness of the second portion of the third electrode is $L_5$, $L_2 \geq L_5$.

The device substrate may include a hole corresponding to the sealing member, and the sealing member may be disposed in the hole.

According to another aspect of the present embodiments, there is provided a method of manufacturing an organic light-emitting apparatus, the method including: preparing a device substrate including a light-emitting area and a non-emitting area; forming a first electrode in the light-emitting area, and farming a third electrode including a first portion and formed of the same material as that of the first electrode in the non-emitting area; forming an organic layer on the first electrode; forming a second electrode on the organic layer, and attaching the device substrate and an encapsulation substrate to each other by assembling the encapsulation substrate with the device substrate so that the encapsulation substrate covers the light-emitting area, and providing a sealing member to the non-emitting area inside the third electrode to surround the light-emitting area.

Each of the first electrode and the third electrode may include at least one material selected from the group consisting of metals and conductive oxides.

Each of the first electrode and the third electrode may comprise ITO.

The providing of the sealing member of the attaching of the device substrate and the encapsulation substrate to each other may include at least one of: providing an adhesive precursor between the device substrate and the encapsulation substrate and curing the adhesive precursor, providing a glass frit precursor between the device substrate and the encapsulation substrate and performing heat treatment, and providing the silicon-based compound represented by Formula 1 between the device substrate and the encapsulation substrate.

The method may further include at least one of creating a vacuum in a space between the device substrate and the encapsulation substrate, providing a moisture-absorbing layer to the space between the device substrate and the encapsulation substrate, and providing a filler to the space between the device substrate and the encapsulation substrate.

The method may further include, after the attaching of the device substrate and the encapsulation substrate to each other, providing a first layer including at least one of the silicon-based compound represented by Formula 1 and a cured product of the silicon-based compound to a space between the sealing member and the first portion of the third electrode.

The forming of the first electrode and the third electrode may further include additionally forming a second portion extending from the first portion of the third electrode toward the sealing member.

The providing of the device substrate including the light-emitting area and the non-emitting area may further include forming a hole corresponding to the sealing member in the non-emitting area of the device substrate.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION OF CERTAIN INVENTIVE EMBODIMENTS

The present embodiments will now be described more fully with reference to the accompanying drawings, in which example embodiments are shown.

Figure 1A:
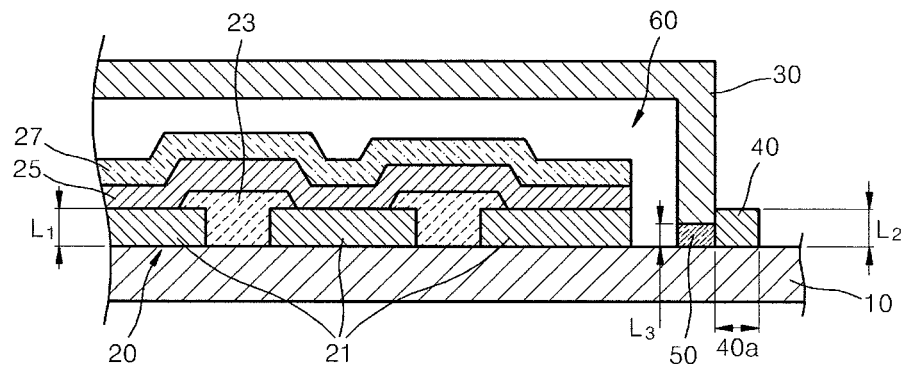
FIG. 1A is a cross-sectional view illustrating an organic light-emitting apparatus (a cross-sectional view taken along line I-I' of FIG. 1B) according to an embodiment.
Figure 1B:
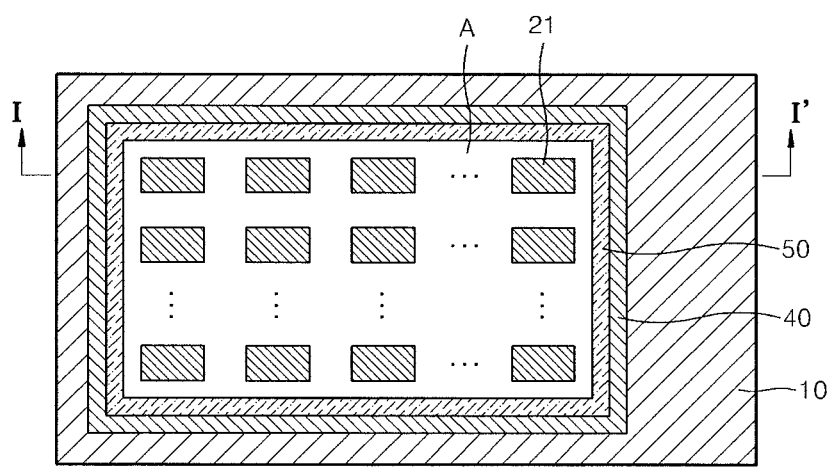
FIG. 1B is a plan view of the organic light-emitting apparatus of FIG. 1A, in which an encapsulation substrate, a second electrode, an organic layer, and an insulating layer are not shown.

FIG. 1A is a cross-sectional view illustrating an organic light-emitting apparatus (a cross-sectional view taken along line I-I' of FIG. 1B) according to an embodiment. FIG. 1B is a plan view of the organic light-emitting apparatus of FIG. 1A, in which an encapsulation substrate 30, a second electrode 27, an organic layer 25, and an insulating layer 23 are not shown.

Referring to FIGS. 1A and 1B, the organic light-emitting apparatus includes a device substrate 10, the encapsulation substrate 30, a first electrode 21, the insulating layer 23, the organic layer 25, the second electrode 27, a sealing member 50, and a third electrode 40 including a first portion 40a. The first electrode 21, the insulating layer 23, the organic layer 25, and the second electrode 27 may constitute an organic light-emitting device 20. Meanwhile, the organic light-emitting apparatus includes a space 60 between the device substrate 10 and the encapsulation substrate 30.

The device substrate 10, which may be any substrate that is used in conventional organic light-emitting apparatuses, may be a glass substrate or a transparent plastic substrate with excellent mechanical strength, thermal stability, transparency, surface smoothness, ease of handling, and water resistance. For example, the device substrate 10 may comprise an inorganic material such as a transparent glass material mainly formed of $SiO_2$, or an insulating organic material such as a transparent plastic material. The insulating organic material may be selected from the group consisting of, for example, polyethersulphone (PES), polyacrylate (PAR), polyetherimide (PEI), polyethyelenen naphthalate (PEN), polyethyelene-terephthalate (PET), polyphenylene sulfide (PPS), polyallylate, polyimide, polycarbonate (PC), cellulose tri acetate (TAC), and cellulose acetate propionate (CAP), but the present embodiment is not limited thereto.

If the organic light emitting apparatus of FIG. 1A is a bottom emission apparatus in which light is emitted from the organic light-emitting device 20 toward the device substrate 10, the device substrate 10 may comprise a transparent material. However, if the organic light emitting apparatus of FIG. 1A is a top emission apparatus in which light is emitted from the organic light-emitting device 20 in a direction opposite to the device substrate 10, the device substrate 10 may comprise a non-transparent material. In the latter case, the device substrate 10 may comprise a metal. If the device substrate 10 comprises a metal, the device substrate 10 may include at least one material selected from the group consisting of carbon, iron, chromium, manganese, nickel, titanium, molybdenum, stainless steel (SUS), an Invar alloy, an Inconel alloy, and a Kovar alloy, but the present embodiment is not limited thereto.

Although not shown in FIG. 1A, a buffer layer (not shown) for planarizing the device substrate 10 and preventing penetration of impurities may be formed on a top surface of the device substrate 10.

The device substrate 10 includes a light-emitting area A and a non-emitting area (area other than the light-emitting area "A" in FIG. 1B).

The encapsulation substrate 30 may be disposed to face the device substrate 10. The encapsulation substrate 30 may be formed to cover the light-emitting area A.

The encapsulation substrate 30 may comprise various materials. For information about materials of the encapsulation substrate 30, the aforesaid materials of the device substrate 10 are referred to.

The organic light-emitting device 20 is disposed between the device substrate 10 and the encapsulation substrate 30. The organic light-emitting device 20 may include the first electrode 21, the insulating layer 23, and the second electrode 27.

The first electrode 21 may be an anode (a hole injection electrode), and may be formed by deposition or sputtering using a material having a high work function. The first electrode 21 may include at least one material selected from the group consisting of metals and conductive oxides. For example, the first electrode 21 may include a metal selected from silver (Ag), magnesium (Mg), aluminum (Al), platinum (Pt), palladium (Pd), gold (Au), nickel (Ni), neodymium (Nd), iridium (Ir), chromium (Cr), and a combination of two or more metals; or a conductive oxide selected from indium tin oxide (ITO), indium zinc oxide (IZO), zinc oxide (ZnO), and indium oxide ($In_2O_3$). Alternatively, the first electrode 21 may comprise a combination (e.g., a mixture or a multi-layer structure) of a metal and a conductive oxide. For example, the first electrode 21 may comprise ITO, but the present embodiment is not limited thereto.

The insulating layer 23 may act as a pixel defining layer. The insulating layer 23 may comprise a general insulating material. For example, the insulating layer 23 may comprise silicon oxide or silicon nitride, but the present embodiment is not limited thereto.

The organic layer 25 may include at least one of a hole injection layer (HIL), a hole transport layer (HTL), an emission layer (EML), a hole blocking layer (HBL), an electron transport layer (ETL) and an electron injection layer (EIL). Each layer of the organic layer 25 will be explained later.

The second electrode 27 may be a cathode (an electron injection electrode), and may comprise a metal, an alloy, an electrically conductive compound, or a mixture thereof which has a relatively low work function. Examples of such materials include lithium (Li), magnesium (Mg), aluminum (Al), aluminum-lithium (Al—Li), calcium (Ca), magnesium-indium (Mg—In), and magnesium-silver (Mg—Ag). Alternatively, the second electrode 27 may comprise ITO or IZO to achieve a top-emission light emitting device.

The organic light-emitting device 20 is disposed between the device substrate 10 and the encapsulation substrate 30 as described above, and the device substrate 10 and the encapsulation substrate 30 may be attached to each other by the sealing member 50 that surrounds the light-emitting area A. The sealing member 50 may comprise an adhesive material so as to attach the device substrate 10 to the encapsulation substrate 30. Also, in order to prevent external oxygen and/or moisture from permeating into the space 60 between the encapsulation substrate 30 and the device substrate 10, the sealing member 50 may have moisture and/or oxygen-preventing characteristics.

The sealing member 50 may include at least one of an adhesive and glass frit.

The adhesive may include at least one of an organic adhesive, an inorganic adhesive, and an organic/inorganic composite adhesive. The adhesive may be a cured product (e.g., a cross-linked product) of an adhesive precursor (e.g., a monomer used to form the adhesive).

Examples of the organic adhesive may include an acryl-based resin, a methacry-based resin, polyisoprene, a vinyl-based resin, an epoxy-based resin, a urethane-based resin, and a cellulose-based resin.

Examples of the acryl-based resin may include butylacrylate and ethylhexylacrylate. Examples of the methacry-based resin may include propylene glycol methacrylate, and tetrahydrofurfuryl methacrylate. Examples of the vinyl-based resin may include vinylacetate and N-vinylpyrrolidone. Examples of the epoxy-based resin may include cycloaliphatic epoxide, epoxy acrylate, and vinyl epoxy-based resin. Examples of the urethane-based resin may include urethane acrylate. Examples of the cellulose-based resin may include cellulosenitrate. However, the present embodiment is not limited thereto.

Examples of the inorganic adhesive may include titania, silicon oxide, zirconia, and alumina.

Examples of the organic/inorganic composite adhesive may include 3-glycidoxypropyltrimethoxysilane or a polymer thereof; epoxy silicate; vinyl silane such as vinyltriethoxysilnae or a polymer thereof; amine silane or a derivative thereof such as 3-aminopropyltriethoxysilane or a polymer thereof; methacrylate silane such as 3-(trimethoxysilyl)propyl acrylate or a polymer thereof; and aryl silane or a derivative thereof such as penyl silane or a polymer thereof, but the present embodiment is not limited thereto.

The glass fit may be obtained by performing heat treatment (e.g., melting) on a glass frit precursor. The glass frit precursor may be any of various metal oxides and non-metal oxides. The heat treatment may be performed on the glass fit precursor by using, for example, a laser beam, but the present embodiment is not limited thereto.

Meanwhile, the sealing member 50 may include at least one of a silicon-based compound represented by Formula 1 and a cured product of the silicon-based compound:

$$F\text{-}[Q_1]_a\text{-}O\text{-}[Q_2\text{-}O]_b\text{-}[Q_3\text{-}O]_c\text{-}[Q_4\text{-}O]_d\text{-}[Q_5]_e\text{-}[Y_1]_f\text{—Si}(Z)_g(Z_2)_{3-g}$$ <Formula 1> where $Q_1$ is a divalent group represented by —C($R_1$)($R_2$)—;

$Q_2$ is a divalent group represented by —C($R_3$)($R_4$)—C($R_5$)($R_6$)—C($R_7$)($R_8$)—;

$Q_3$ is a divalent group represented by —C($R_9$)($R_{10}$)—C($R_{11}$)($R_{12}$)—;

$Q_4$ is a divalent group represented by —C($R_{13}$)($R_{14}$)—;

$Q_5$ is a divalent group represented by —C($R_{15}$)($R_{16}$)—;

$R_1$ through $R_{16}$ are each independently selected from the group consisting of H, —F, —$CH_3$, —$CH_2F$, —$CHF_2$, and —$CF_3$;

$Y_1$ is a divalent organic group;

$Z_1$ is a $C_1$-$C_{30}$ alkyl group or a $C_1$-$C_{30}$ alkyl group that is substituted with at least one —F;

$Z_2$ is a $C_1$-$C_{30}$ alkoxy group or a $C_1$-$C_{30}$ alkoxy group that is substituted with at least one —F;

a and e are each independently an integer from 1 to 20;

b, c, and d are each independently an integer from 0 to 200, and a case where b, c, and d are all 0 is excluded;

f is an integer from 0 to 10; and g is an integer from 0 to 3.

In Formula 1, $Q_1$ may be a divalent group represented by —$CF_2$—, —CHF—, —$CF(CF_3)$—, or —$C(CF_3)_2$—. For example, $Q_1$ may be —$CF_2$—. a may be an integer from 1 to 5, for example, 2, 3, or 4, but the present embodiment is not limited thereto. If a is 2 or greater, at least two $Q_1$ may be the same or different.

For example, in Formula 1, "F-$[Q_1]_a$-" may be $CF_3CF_2CF_2$—, but the present embodiment is not limited thereto.

In Formula 1, $Q_2$ may be a divalent group represented by —$CF_2CF_2CF_2$—, —$CF(CF_3)CF_2CF_2$—, —$CF_2CF_2CH_2$—, or —$CH_2CF_2CHF$—. For example, $Q_2$ may be —$CF_2CF_2CF_2$— or —$CF_2CF_2CH_2$—. b may be an integer from 0 to 50, for example, an integer from 0 to 31, but the present embodiment is not limited thereto. If b is 2 or greater, at least two $Q_2$ may be the same or different.

For example, in Formula 1, b may be 0. Alternatively, in Formula 1, "-$[Q_2$-O$]_b$-" may be —$(CF_2CF_2CF_2O)_{21}CF_2CF_2CH_2O$—, —$(CF_2CF_2CF_2O)_{30}CF_2CF_2CH_2O$—, —$(CF_2CF_2CF_2O)_{21}$—, —$(CF_2CF_2CF_2O)_{11}CF_2CF_2CH_2O$—, or —$(CF_2CF_2CF_2O)_{11}$—, but the present embodiment is not limited thereto.

In Formula 1, $Q_3$ may be a divalent group represented by —$CF_2CF_2$—, —$CF(CF_3)CF_2$—, —$CF_2CH_2$—, —$CF(CF_3)CH_2$—, or —$CH_2CHF$—. c may be an integer from 0 to 20, for example, an integer from 0 to 10, or for example, an integer from 1 to 6, but the present embodiment is not limited thereto. If c is 2 or greater, at least two $Q_3$ may be the same or different.

For example, in Formula, c may be 0. Alternatively, in Formula 1, "-$[Q_3$-O$]_c$-" may be —$CF(CF_3)CH_2O$—, —$[CF(CF_3)CF_2O]_3$—, —$[CF(CF_3)CF_2O]_3CF(CF_3)CH_2O$—, —$[CF(CF_3)CF_2O]_4CF(CF_3)CH_2O$—, or —$[CF(CF_3)CF_2O]_5CF(CF_3)CH_2O$—, but the present embodiment is not limited thereto In Formula 1, $Q_4$ may be a divalent group represented by —$CF_2$—, —$CF(CF_3)$—, —CHF—, or —$CH(CF_3)$—. d may be an integer from 0 to 20, for example, an integer from 0 to 10, but the present embodiment is not limited thereto. If d is 2 or greater, at least two $Q_4$ may be the same or different.

For example, in Formula 1, d may be 0. Alternatively, in Formula 1, "-$[Q_4$-O$]_d$-" may be —$(CF_2O)_{10}$—, but the present embodiment is not limited thereto.

In Formula 1, $Q_5$ may be a divalent group represented by —$CH_2$—, —$CF_2$—, —$CF(CF_3)$—, —CHF—, or —$CH(CF_3)$—. e may be an integer from 1 to 20, for example, an integer from 1 to 10, or for example, an integer from 1 to 3, but the present embodiment is not limited thereto. If e is 2 or greater, at least two $Q_5$ may be the same or different.

For example, in Formula 1, "-$[Q_5]_e$-" may be —$CH_2CH_2CH_2$—, —$CF_2CF_2$— or —$CF(CF_3)$—, but the present embodiment is not limited thereto.

In Formula 1, $Y_1$ may be a divalent group selected from the group consisting of —CONH—, —$Si(R_{20})(R_{21})$—, a $C_2$-$C_{20}$ alkylene group (e.g., an ethylene group, a propylene group, a butylene group, or a pentylene group) and a $C_2$-$C_{20}$ alkylene group that is substituted with at least one —F. Here, $R_{20}$ and $R_{21}$ may be each independently selected from the group consisting of a $C_1$-$C_{10}$ alkyl group (e.g., a methyl group, an ethyl group, a propyl group, a butyl group, a pentyl group, or a hexyl group), a $C_1$-$C_{10}$ alkyl group that is substituted with at least one F, a $C_1$-$C_{10}$ alkoxy group (e.g., a methoxy group, an ethoxy group, a propoxy group, a butoxy group, or a pentoxy group), and a $C_1$-$C_{10}$ alkoxy group that is substituted with at least one F. f may be an integer from 0 to 5, In Formula 1, f may be 0. Alternatively, in Formula 1, "-$[Y_1]_f$-" may be —CONH—$CH_2CH_2CH_2$—, —$Si(Me)_2$-$Si(OMe)_2$-$CH_2CH_2$—, or —CONH—$CH_2CH_2CH_2$—$Si(Me)_2$-$Si(OMe)_2$-$CH_2CH_2$—, but the present embodiment is not limited thereto. (In the above, Me is a methyl group.)

In Formula 1, $Z_1$ may be a $C_1$-$C_{10}$ alkyl group or a $C_1$-$C_{10}$ alkyl group that is substituted with at least one —F. For example, $Z_1$ may be a methyl group, an ethyl group, a propyl group, a butyl group, or a pentyl group.

In Formula 1, $Z_2$ may be a $C_1$-$C_{10}$ alkoxy group or a $C_1$-$C_{10}$ alkoxy group that is substituted with at least one —F. For example, $Z_2$ may be a methoxy group, an ethoxy group, a propoxy group, a butoxy group, or a pentoxy group.

In Formula 1, g may be 0, 1, 2, or 3. For example, g may be 0.

The sealing member 50 may include the silicon-based compound.

Meanwhile, when the sealing member 50 is formed, according to whether heat, a cross-linking catalyst, or the like is provided, a cured product of the silicon-based compound that is cross-linked may be formed. Accordingly, the sealing member 50 may include a cured product of the silicon-based compound.

Alternatively, the sealing member 50 may include both the silicon-based compound and the cured product of the silicon-based compound.

Meanwhile, according to conditions under which the sealing member 50 is formed, a self-assembly monolayer (SAM) may be additionally formed in an area of the sealing member 50 contacting the device substrate 10, an area of the sealing member 50 contacting the encapsulation substrate 30, an area of the sealing member 50 contacting the first portion 40a of the third electrode 40, and/or an area of the sealing member 50 contacting a second portion 240b of the third electrode 240 that will be explained later. The SAM may be formed by a reaction between $Z_2$ of the silicon-based compound and a hydrophilic group, for example, —OH, which may exist in the device substrate 10, the encapsulation substrate 30, the first portion 40a of the third electrode 40, and/or the second portion 240b of the third electrode 240. The SAM may include a moiety represented by Formula 1a:

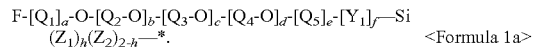

F-$[Q_1]_a$-O-$[Q_2$-O$]_b$-$[Q_3$-O$]_c$-$[Q_4$-O$]_d$-$[Q_5]_e$-$[Y_1]_f$—Si$(Z_1)_h(Z_2)_{2-h}$—*. <Formula 1a>

For information about the moiety represented by Formula 1a, Formula 1 is referred to. In Formula 1a, h is an integer from 0 to 2, and * is a binding site with a surface of an area where the SAM is formed from the silicon-based compound. For example, in Formula 1a, * is a binding site with a surface of the device substrate 10, a surface of the encapsulation substrate 30, a surface of the first portion 40a of the third electrode 40, and/or a surface of the second portion 240b of the third electrode 240.

Which combination the sealing member 50 includes from at least one of the silicon-based compound represented by Formula 1 and the cured product of the silicon-based compound (and optionally, the SAM formed from the silicon-based compound) may vary according to conditions under which the sealing member 50 is formed.

The silicon-based compound may provide very low surface energy. Accordingly, since a surface, which is exposed to the outside, of the sealing member 50 including at least one of the silicon-based compound represented by Formula 1 and the cured product of the silicon-based compound (and optionally, the SAM formed from the silicon-based compound) has low surface energy, moisture and/or oxygen may not attach itself to the surface of the sealing member 50. Accordingly, moisture and/or oxygen may be prevented from permeating through the sealing member 50.

The sealing member 50 may have a multi-layer structure including two or more materials.

Figure 2:
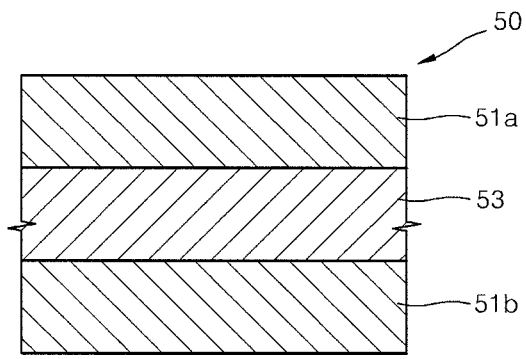
FIG. 2 is a cross-sectional view of a sealing member according to an embodiment.

For example, as shown in FIG. 2, the sealing member 50 may include a first sealing member layer 51b, a second sealing member layer 53, and a third sealing member layer 51a which are sequentially stacked from the device substrate 10 (or from the second portion 240b of the third electrode 240 as will be described later). Each of the first sealing member layer 51b and the third sealing member layer 51a may include the aforesaid adhesive. The second sealing member 53 may include at least one of the silicon-based compound represented by Formula 1 and the cured product of the silicon-based compound (and optionally, the SAM formed from the silicon-based compound).

The third electrode 40 is disposed on the non-emitting area outside the sealing member 50. In FIG. 1A, the third electrode 40 includes the first portion 40a that surrounds the sealing member 50. The first electrode 21 and the third electrode 40 are formed of the same material. For example, each of the first electrode 21 and the third electrode 40 may comprise ITO, but the present embodiment is not limited thereto.

A side surface of the sealing member 50 and a side surface of the first portion 40a of the third electrode 40 contact each other. Accordingly, oxygen and/or moisture may be substantially prevented from permeating into the space 60 between the encapsulation substrate 30 and the device substrate 10 through the side surface of the sealing member 50, thereby preventing the organic light-emitting device 20 from deteriorating due to the oxygen and/or moisture.

The third electrode 40 may be a "floating electrode" that is not connected to a power supply source, unlike the first electrode 21 and the second electrode 27.

A maximum thickness $L_1$ of the first electrode 21 and a maximum thickness $L_2$ of the first portion 40a of the third electrode 40 may have a relationship of $L_1=L_2$.

Meanwhile, the maximum thickness $L_2$ of the first portion 40a of the third electrode 40 and a maximum thickness $L_3$ of the sealing member 50 may have a relationship of $L_2 \geq L_3$. Here, since a portion of the first portion 40a of the third electrode 40 contacting with the sealing member 50 has the maximum thickness $L_2$, the side surface of the sealing member 50 may not be exposed to the outside. Accordingly, oxygen and/or moisture may be effectively prevented from permeating into the space 60 between the encapsulation substrate 30 and the device substrate 10 through the side surface of the sealing member 50, thereby preventing the organic light-emitting device 20 from deteriorating due to the moisture and/or oxygen.

The space 60 between the device substrate 10 and the encapsulation substrate 30 may be a vacuum space.

Alternatively, a moisture-absorbing layer (not shown in FIG. 1A) may be further included in the space 60 between the device substrate 10 and the encapsulation substrate 30.

The moisture-absorbing layer may be located on a bottom surface of the encapsulation substrate 30 or an inner side of the sealing member 50.

The moisture-absorbing layer may absorb oxygen and/or moisture, even though it is a small amount, being present in the space 60 between the device substrate 10 and the encapsulation substrate 30. To this end, the moisture-absorbing layer may include a metal oxide having an average diameter of 100 nm or less. The metal oxide may be alkali metal oxide or alkaline earth metal oxide. Examples of the alkali metal oxide may include lithium oxide ($Li_2O$), sodium oxide ($Na_2O$) and potassium oxide ($K_2O$), and examples of the alkaline earth metal oxide may include barium oxide (BaO), calcium oxide (CaO) and magnesium oxide (MgO), but the present embodiment is not limited thereto.

The moisture-absorbing layer may further, optionally, include a binder and a dispersing agent.

Alternatively, a filler (not shown in FIG. 1A) may fill the space 60 between the device substrate 10 and the encapsulation substrate 30. Accordingly, the space 60 between the device substrate 10 and the encapsulation substrate 30 is completely filled by the organic light-emitting device 20 and the filler, and there may no empty space between the device substrate 10 and the encapsulation substrate 30.

The filler may be a material having a predetermined visible light transmittance so as not to substantially react with a material of the organic light-emitting device 20 and to enable light emitted from the organic light-emitting device 20 to be effectively extracted to the outside. For example, the filler may be silicon, an epoxy resin, or the like.

Meanwhile, the filler may include at least one of the silicon-based compound represented by Formula 1 and the cured product of the silicon-based compound (and optionally, the SAM formed from the silicon-based compound). Formula 1 has been described above, and will not be described herein.

Since the silicon-based compound has low surface energy, if the silicon-based compound represented by Formula 1 is used as the filler, moisture and/or oxygen being present between the device substrate 10 and the encapsulation substrate 30, even though it is a small amount, may be prevented from reaching the organic light-emitting device 20. Accordingly, the organic light-emitting device 20 may be effectively prevented from deteriorating due to the moisture and/or oxygen, thereby making it possible to realize an organic light-emitting apparatus having a long lifetime.

A method of manufacturing the organic light-emitting apparatus illustrated in FIGS. 1A and 1B will now be explained with reference to FIGS. 3A through 3D.

First, the device substrate 10 including the light-emitting area and the non-emitting area is prepared. The device substrate 10 may include a driving transistor or a switching transistor.

Figure 3A:
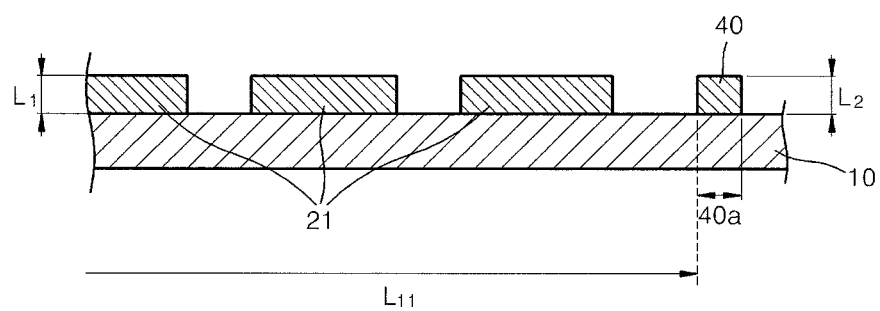
FIGS. 3A through 3D are cross-sectional views sequentially illustrating a method of manufacturing the organic light-emitting apparatus of FIG. 1A, according to an embodiment.

Next, as shown in FIG. 3A, the first electrode 21 is formed in the light-emitting area of the device substrate 10, and the third electrode 40 including the first portion 40a is formed in the non-emitting area of the device substrate 10. In this case, the third electrode 40 and the first electrode 21 may be simultaneously formed. For example, the first electrode 21 and the third electrode 40 each formed of ITO may be simultaneously formed by forming an ITO layer in the light-emitting area and the non-emitting area of the device substrate 10 and simultaneously patterning the first electrode 21 and the third electrode 40. Alternatively, the first electrode 21 and the third electrode 40 each formed of ITO may be simultaneously formed by depositing ITO on the device substrate 10 by using a mask including patterns of the first electrode 21 and the third electrode 40. In this case, the thickness $L_1$ of the first electrode 21 and the thickness $L_2$ of the third electrode 40 may be the same.

According to the method, since the third electrode 40 is also formed when the first electrode 21 is formed, a separate process of forming the third electrode 40 is not necessary. Accordingly, the method of manufacturing the organic light-emitting apparatus may be performed in an easy and simple manner at low cost.

The first electrode 21 and the third electrode 40 may be formed by a well-known method (e.g., laser etching, wet etching, or deposition using a mask including a predetermined pattern).

Figure 3B:
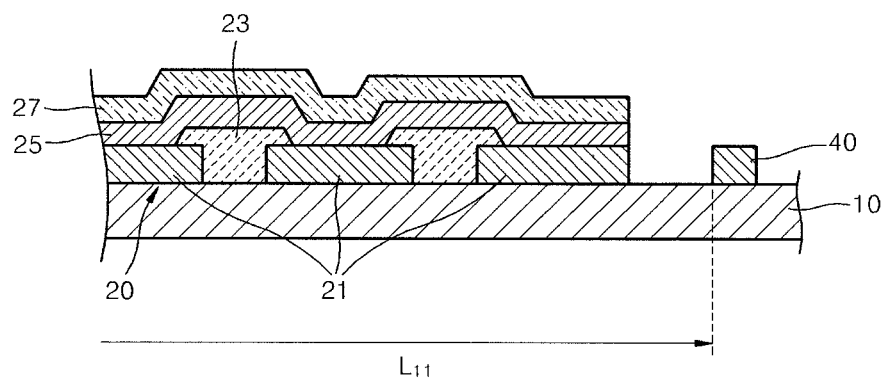

Next, as shown in FIG. 3B, the insulating layer 23 formed on both ends of the first electrode 21, the organic layer 25, and the second electrode 27 are sequentially formed, thereby forming the organic light-emitting device 20.

A material and a formation method of each of layers included in the organic layer 25 will now be explained.

The HIL may be formed by any well-known method such as vacuum deposition, spin-coating, casting, or Langmuir-Blodgett (LB) deposition. If the HIL is formed by vacuum deposition, deposition conditions may vary according to a target compound that is used to form the HIL, and the structure and thermal characteristics of the HIL to be formed. For example, the deposition conditions may include a deposition temperature of about 100° C. to about 500° C., a degree of vacuum of about $10^{-10}$ to about $10^{-3}$ torr, and a deposition rate of about 0.01 to 100 Å/sec. Meanwhile, if the HIL is formed by spin coating, coating conditions may vary according to a target compound that is used to form the HIL, and the structure and thermal characteristics of the HIL to be formed. For example, the coating conditions may include a coating speed of about 2000 rpm to 5000 rpm and a heat treatment temperature of about 80° C. to 200° C. (at which a solvent is removed after coating).

The HIL may comprise any material that is commonly used to form an HIL. Examples of the material that may be used to form the HIL include a phthalocyanine compound such as copperphthalocyanine, 4,4',4''-tris(3-methylphenylphenylamino)triphenylamine (m-MTDATA, see the following formula), N,N'-di(1-naphthyl)-N,N'-diphenylbenzidine (NPB), TDATA (see the following formula), 2T-NATA (see the following formula), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate) (PANI/PSS), but the present embodiment is not limited thereto.

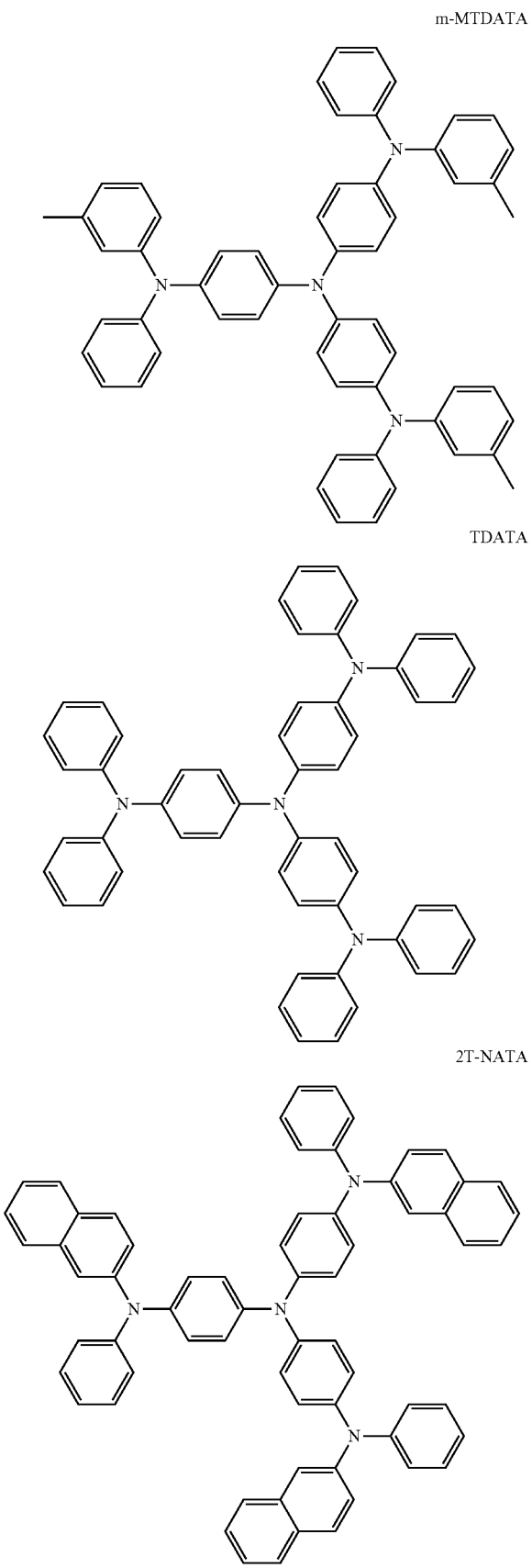

A thickness of the HIL may be in a range of about 10 to about 10,000 Å, for example, about 100 to about 1,000 Å. When the thickness of the HIL is within this range, the HIL may have excellent hole injection properties without an increase in driving voltage.

The HTL may be fainted by a method selected from various well-known methods such as vacuum deposition, spin coating, casting, and Langmuir-Blodgett (LB) deposition. In this regard, deposition conditions and coating conditions may vary according to a target compound and the structure and thermal characteristics of the HTL to be formed, but may be the same or similar to those described with reference to the HIL.

The HTL may comprise any material that is commonly used to form an HTL. Examples of the material that may be used to form the HTL include: N-phenylcarbazole; an amine derivative having an aromatic condensation ring such as N,N'-bis(3-methylphenyl)-N,N-diphenyl-[1,1-biphenyl]-4,4'-diamine (TPD); and a triphenylamine-based material such as 4,4',4''-tris(N-carbazolyl)triphenylamine (TCTA). Among these materials, TCTA may not only transport holes but also inhibit excitons from being diffused from the EML.

A thickness of the HTL may be in a range of about 50 to 1,000 Å, for example, about 100 to about 600 Å. When the thickness of the HTL is within this range, the HTL may have excellent hole-transporting properties without a substantial increase in driving voltage.

The EML may be formed by any well-known method such as vacuum deposition, spin-coating, casting, or Langmuir-Blodgett (LB) deposition. In this regard, deposition conditions and coating conditions may vary according to a target compound and the structure and thermal characteristics of the EML to be formed, but may be the same or similar to those described with reference to the HIL.

The EML may include only a single light-emitting material. In some cases, however, the EML may include a host and a dopant.

Examples of the host may include aluminum tris(8-hydroxyquinoline) (Alq3), 4,4'-N,N'-dicarbazole-biphenyl (CBP), 9,10-di(naphthalene-2-yl)anthracene (ADN), TCTA, 1,3,5-tris(N-phenylbenzimidazole-2-yl)benzene) (TPBI), 3-tert-butyl-9,10-di(naphth-2-yl)anthracene (TBADN), and E3, but the present embodiment is not limited thereto.

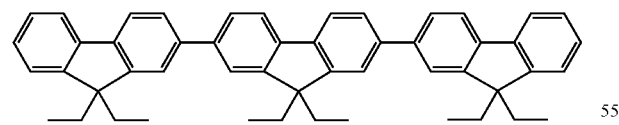

E3

Meanwhile, examples of well-known red dopants include PtOEP, Ir(piq)3, and Btp2Ir(acac), but the present embodiment is not limited thereto.

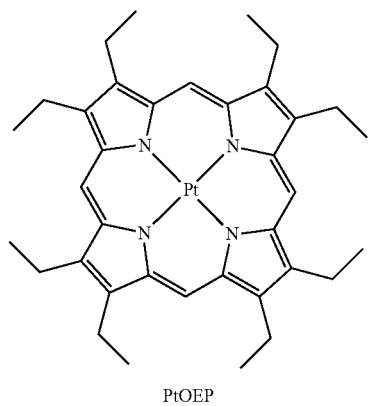

PtOEP

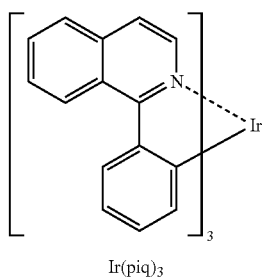

Ir(piq)3

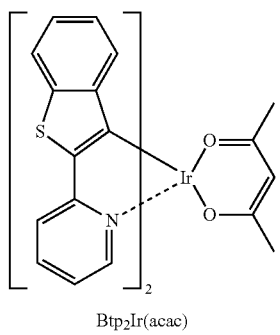

Btp2Ir(acac)

Also, examples of well-known green dopants include Ir(ppy)3 (ppy=phenylpyridine), Ir(ppy)2(acac), and Ir(mpyp)3, but the present embodiment is not limited thereto.

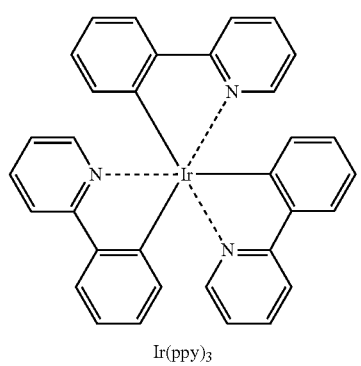

Ir(ppy)3

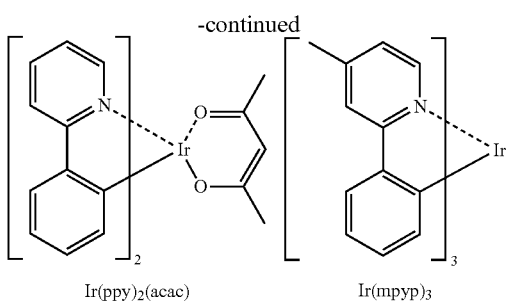

Ir(ppy)₂(acac)　　　　Ir(mpyp)₃

Meanwhile, examples of well-known blue dopants include F₂Irpic, (F₂ppy)₂Ir(tmd), Ir(dfppz)₃, ter-fluorene, 4,4'-bis[4-(di-p-tolylamino)styryl]biphenyl (DPAVBi), and 2,5,8,11-tetra-tert-butyl perylene (TBP), but the present embodiment is not limited thereto.

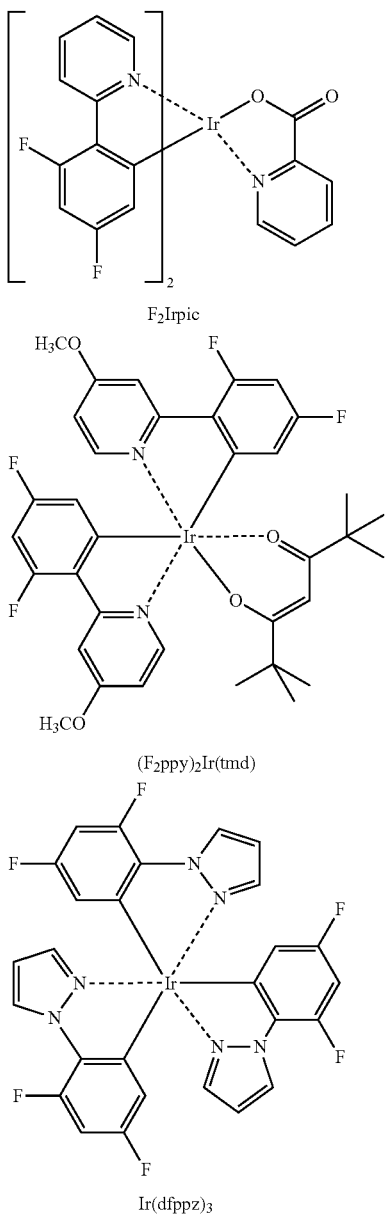

A thickness of the EML may be in a range of about 100 to about 1,000 Å, for example, about 100 to about 600 Å. When the thickness of the EML is within this range, the EML may have excellent light-emitting properties without a substantial increase in driving voltage.

For example, if the EML includes a phosphorescent compound, the HBL, which blocks triplet excitons or holes from diffusing into, for example, a cathode, may be further formed on the EML. The HBL may be formed by a method selected from various well-known methods such as vacuum deposition, spin coating, casting, and Langmuir-Blodgett (LB) deposition. In this regard, deposition conditions and coating conditions may vary according to a target compound and the structure and thermal characteristics of the HBL to be formed, but may be the same or similar to those described with reference to the HIL.

The HBL may comprise any well-known hole blocking material. In this regard, examples of hole blocking materials may include an oxadiazole derivative, a triazole derivative, and a phenanthroline derivative.

A thickness of the HBL may be in a range of about 50 to 1,000 Å, for example, about 100 to about 300 Å. When the thickness of the HBL is within this range, the HBL may have excellent hole blocking characteristics without a substantial increase in driving voltage.

The ETL may be formed on the EML or the HBL by a method selected from various well-known methods such as vacuum deposition, spin coating, casting, and Langmuir-Blodgett (LB) deposition. In this regard, deposition conditions and coating conditions may vary according to a target compound and the structure and thermal characteristics of the ETL to be formed, but may be the same or similar to those described with reference to the HIL.

The ETL may comprise any well-known electron transporting material. Examples of electron transporting materials include tris(8-quinolinolate)aluminum (Alq₃), TAZ, 4,7-diphenyl-1,10-phenanthroline (Bphen), BCP, BeBq₂, and BAlq:

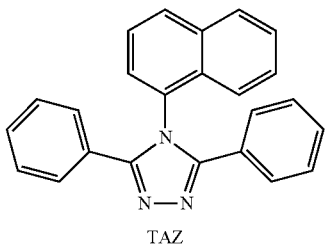

TAZ

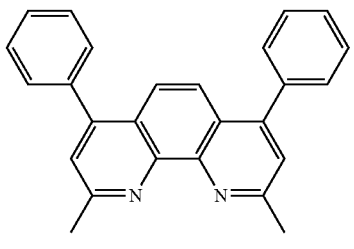

BCP

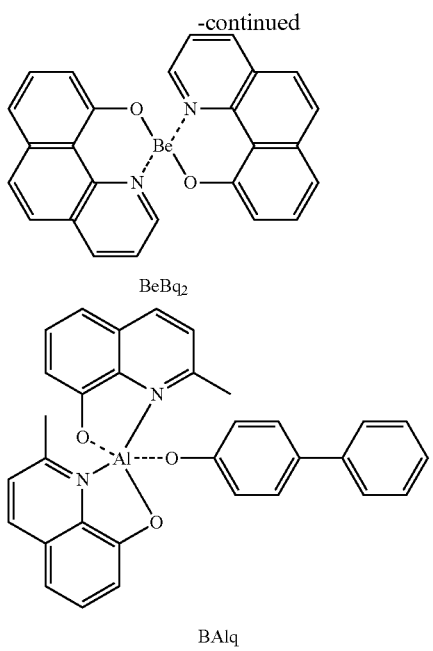

BeBq₂

BAlq

A thickness of the ETL may be in a range of about 100 to about 1,000 Å, for example, about 200 to about 500 Å. When the thickness of the ETL is within this range, the ETL may have excellent electron transport properties without a substantial increase in driving voltage.

The EIL may be formed on the ETL. The EIL may comprise any well-known electron injection material such as LiF, NaCl, CsF, Li₂O, or BaO. Deposition conditions for forming the EIL may vary according to a compound that is used to form the EIL, but may be similar to those described with reference to the HIL.

A thickness of the EIL may be in a range of about 1 to about 100 Å, for example, about 5 to about 50 Å. When the thickness of the EIL is within this range, the EIL may have satisfactory electron injection properties without a substantial increase in driving voltage.

Next, the second electrode 27 is formed on the organic layer 25.

Figure 3C:
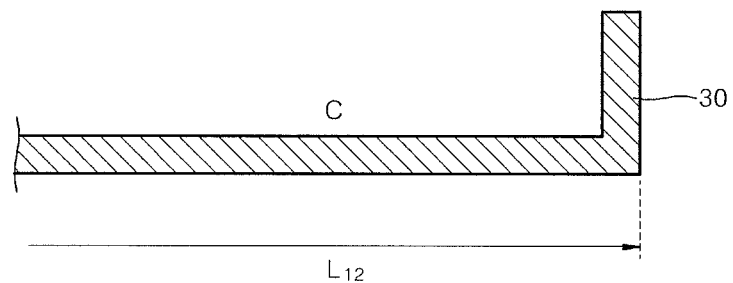

Meanwhile, as shown in FIG. 3C, the encapsulation substrate 30 is prepared. In this case, a width $L_{12}$ of the encapsulation substrate 30 may be determined in consideration of considering a width $L_{11}$ (see FIGS. 3A and 3B) of an area of the device substrate 10 inside the third electrode 40. In order to realize the organic light-emitting apparatus illustrated in FIG. 1A, the width $L_{12}$ of the encapsulation substrate 30 may be determined to be the same as the width $L_{11}$ of the area of the device substrate 10 inside the third electrode 40.

Figure 3D:
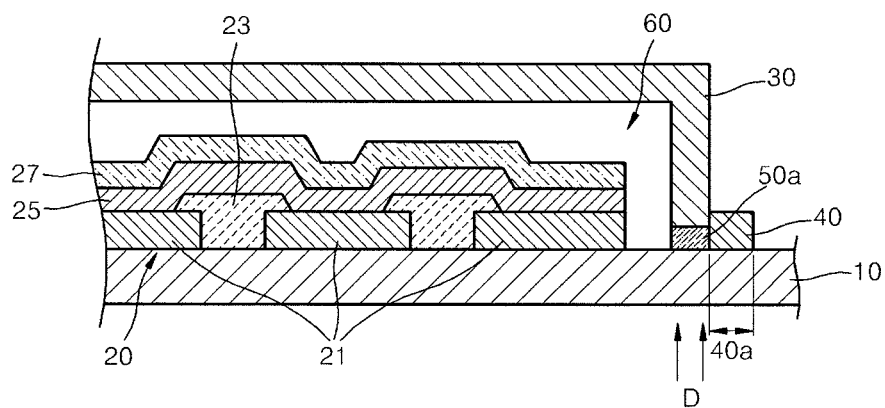

Next, as shown in FIG. 3D, the encapsulation substrate 30 and the device substrate 10 are assembled so that the encapsulation substrate 30 covers the light-emitting area A, a sealing member forming material 50a for forming the sealing member 50 provided between the device substrate 10 and the encapsulation substrate 30 is subjected to a first process D to form the sealing member 50 that is provided in the non-emitting area inside the third electrode 40 to surround the light-emitting area A, and the device substrate 10 and the encapsulation substrate 30 are attached to each other.

The first process D for forming the sealing member 50 from the sealing member forming material 50a may vary according to the selected sealing member forming material 50a. For example, the first process D may be soft baking for removing a solvent included in the sealing member forming material 50a, UV radiation and/or heat treatment for curing the sealing member forming material 50a, or laser beam radiation, which is a kind of heat treatment, for melting the sealing member forming material 50a.

For example, the providing of the sealing member 50 for attaching the device substrate 10 and the encapsulation substrate 30 to each other may be performed by at least one of i) providing an adhesive precursor between the device substrate 10 and the encapsulation substrate 30 and curing the adhesive precursor (by using, for example, UV radiation or heat treatment), ii) providing a glass fit precursor between the device substrate 10 and the encapsulation substrate 30 and performing heat treatment (for example, laser beam radiation), and iii) providing the silicon-based compound represented by Formula 1 between the device substrate 10 and the encapsulation substrate 30. Formula 1 is described above, and will not be described again here.

Meanwhile, the method of manufacturing the organic light-emitting apparatus may further include a) creating a vacuum in the space 60 between the device substrate 10 and the encapsulation substrate 30, b) providing a moisture-absorbing layer to the space 60 between the device substrate 10 and the encapsulation substrate 30, and c) providing a filler to the space 60 between the device substrate 10 and the encapsulation substrate 30. The filler is described in more detail above.

Here, the providing of the filler may be performed, for example, after providing the filler to an inner area C of the encapsulation substrate 30 in FIG. 3C, by attaching the device substrate 10 and the encapsulation substrate 30.

Figure 4A:
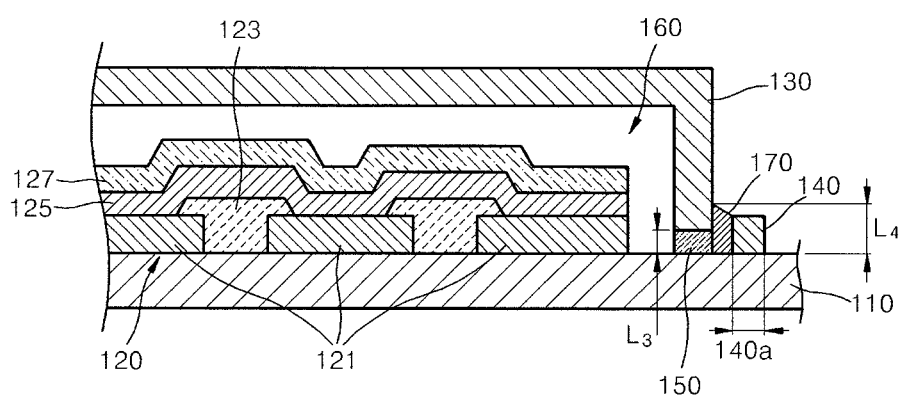
FIG. 4A is a cross-sectional view illustrating an organic light-emitting apparatus (a cross-sectional view taken along line I-I' of FIG. 4B) according to another embodiment.
Figure 4B:
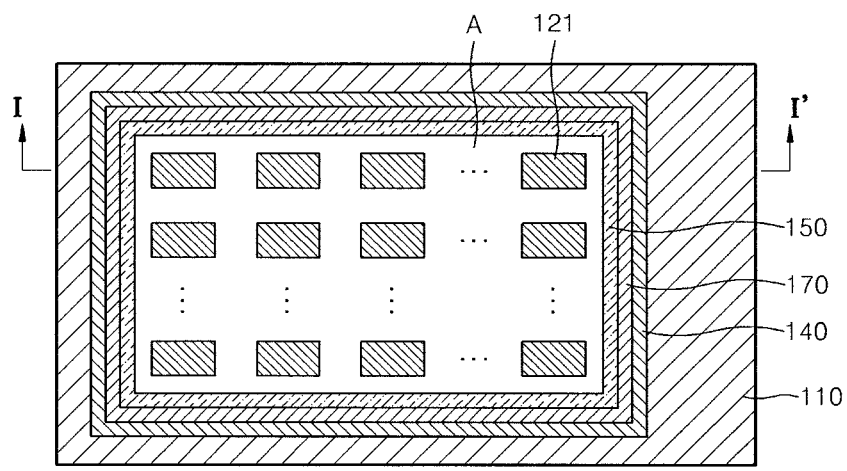
FIG. 4B is a plan view of the organic light-emitting apparatus of FIG. 4A, in which an encapsulation layer, a second electrode, an organic layer, and an insulating layer are not shown.

FIG. 4A is a cross-sectional view illustrating an organic light-emitting apparatus (a cross-sectional view taken along line I-I' of FIG. 4B) according to another embodiment. FIG. 4B is a plan view of the organic light-emitting apparatus of FIG. 4A, in which an encapsulation substrate 130, a second electrode 127, an organic layer 125, and an insulating layer 123 are not shown. The organic light-emitting apparatus illustrated in FIGS. 4A and 4B includes a device substrate 110, the encapsulation substrate 130, a first electrode 121, the insulating layer 123, the organic layer 125, the second electrode 127, a sealing member 150, a third electrode 140 including a first portion 140a, and a first layer 170. The first electrode 121, the insulating layer 123, the organic layer 125, and the second electrode 127 may constitute an organic light-emitting device 120. The organic light-emitting apparatus may include a space 160 between the device substrate 110 and the encapsulation substrate 130.

For information about the device substrate 110, the encapsulation substrate 130, the first electrode 121, the insulating layer 123, the organic layer 125, the second electrode 127, the sealing member 150, the third electrode 140 including the first portion 140a, and the space 160 between the device substrate 110 and the encapsulation substrate 130 of the organic light-emitting apparatus of FIGS. 4A and 4B, the substrate 10, the encapsulation substrate 30, the first electrode 21, the insulating layer 23, the organic layer 25, the second electrode 27, the sealing member 50, the third electrode 40 including the first portion 40a, and the space 60 between the device substrate 10 and the encapsulation substrate 30 of FIGS. 1A and 1B may be referred to.

In the organic light-emitting apparatus of FIGS. 4A and 4B, the sealing member 150 and the first portion 140a of the third electrode 140 are spaced apart from each other, and a space between the sealing member 150 and the first portion 140a of the third electrode 140 is filled with the first layer 170. Here, the first layer 170 may include at least one of the silicon-based compound represented by Formula 1 and the cured product of the silicon-based compound (and optionally, the SAM formed from the silicon-based compound). Formula 1 is described above, and will not be described again here.

Since the silicon-based compound may provide very low surface energy, the surface energy of a surface, which is exposed to external air, of the first layer 170 is very low. Accordingly, since moisture and/or oxygen is prevented by not only the third electrode 140 but also the first layer 170, the organic light-emitting device 120 of the organic light-emitting apparatus of FIGS. 4A and 4B may be effectively prevented from deteriorating due to the moisture and/or oxygen, thereby extending the lifetime of the organic light-emitting apparatus.

The organic light-emitting apparatus of FIGS. 4A and 4B may be manufactured by attaching the device substrate 110 and the encapsulation substrate 130 so that the width $L_{12}$ (see FIG. 3C) of the encapsulation substrate 130 is less than the width $L_{11}$ (see FIG. 3C) of the device substrate 110 inside the third electrode 140 and forming the first layer 170 in the space between the sealing member 150 and the first portion 140a of the third electrode 140. The first layer 170 may be formed by providing the silicon-based compound (and optionally, a solvent) represented by Formula 1 to the space formed between the sealing member 150 and the first portion 140a of the third electrode 140 by any well-known method, such as inkjet printing or nozzle printing, and performing an additional process such as soft baking, but the present embodiment is not limited thereto.

Figure 5:
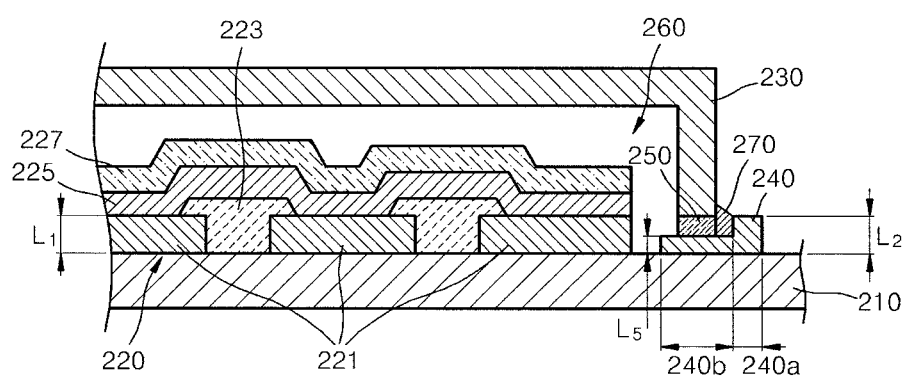
FIG. 5 is a cross-sectional view illustrating an organic light-emitting device according to another embodiment.

FIG. 5 is a cross-sectional view illustrating an organic light-emitting apparatus according to another embodiment. The organic light-emitting apparatus of FIG. 5 includes a device substrate 210, an encapsulation substrate 230, a first electrode 221, an insulating layer 223, an organic layer 225, a second electrode 227, a sealing member 250, a third electrode 240 including a first portion 240a and a second portion 240b, and a first layer 270. The first electrode 221, the insulating layer 223, the organic layer 225, and the second electrode 227 may constitute an organic light-emitting device 220. The organic light-emitting apparatus includes a space 260 between the device substrate 210 and the encapsulation substrate 230.

For information about the device substrate 210, the encapsulation substrate 230, the first electrode 221, the insulating layer 223, the organic layer 225, the second electrode 227, the sealing member 250, the first layer 270, the first portion 240a, the third electrode 240, and the space 260 between the device substrate 210 and the encapsulation substrate 230 of the organic light-emitting apparatus of FIG. 5, the device substrate 110, the encapsulation substrate 130, the first electrode 121, the insulating layer 123, the organic layer 125, the second electrode 127, the sealing member 150, the first layer 170, the first portion 140a, the third electrode 140, and the space 160 between the device substrate 110 and the encapsulation substrate 130 of the organic light-emitting apparatus of FIGS. 4A and 4B may be referred to.

The third electrode 240 of the organic light-emitting apparatus of FIG. 5 includes the first portion 240a that surrounds the sealing member 250, and further includes the second portion 240b that extends from the first portion 240a of the third electrode 240 toward the sealing member 250. The maximum thickness $L_2$ of the first portion 240a of the third electrode 240 and a maximum thickness $L_5$ of the second portion 240b of the third electrode 240 may have a relationship of $L_2 \geq L_5$.

Since the second portion 240b of the third electrode 240 is formed, moisture and/or oxygen permeation may be effectively prevented.

A method of manufacturing the organic light-emitting apparatus of FIG. 5 will be explained with reference to FIGS. 6A through 6D.

Figure 6A:
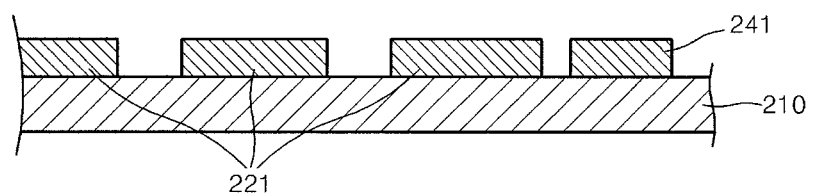
FIGS. 6A through 6D are cross-sectional views sequentially illustrating a method of manufacturing the organic light-emitting apparatus of FIG. 5, according to another embodiment.

First, as shown in FIG. 6A, the device substrate 210 is prepared, and then the first electrode 221 and a third layer 241 are simultaneously formed. The forming of the first electrode 221 and the third layer 241 may be performed by simultaneously forming the first electrode 221 and the third layer 241 without a separate process of forming the third layer 241, like in the forming of the first electrode 21 and the third electrode 24 of FIG. 3A.

Figure 6B:
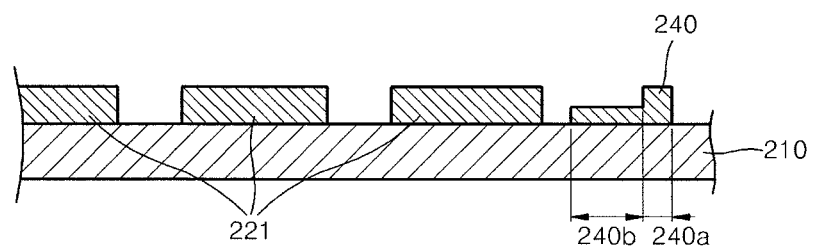

Next, as shown in FIG. 6B, part of the third layer 241 is patterned and thus the first portion 241a and the second portion 240b of the third layer 241 are formed, thereby forming the third electrode 240. The first portion 240a and the second portion 240b may be formed by a general patterning method such as laser etching or wet etching.

Figure 6C:
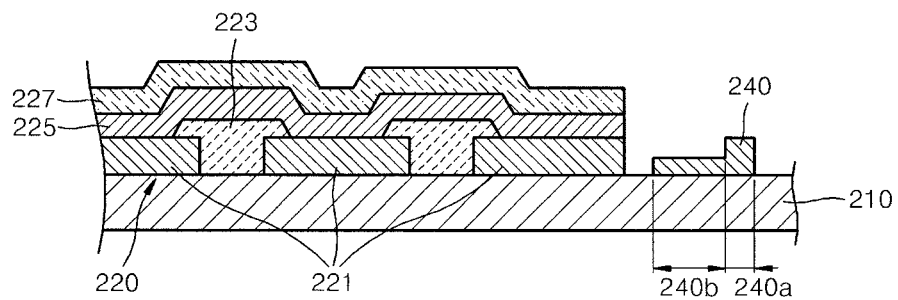

Next, as shown in FIG. 6C, the insulating layer 223, the organic layer 225, and the second electrode 227 are sequentially formed, as explained in detail with reference to FIG. 3B.

Figure 6D:
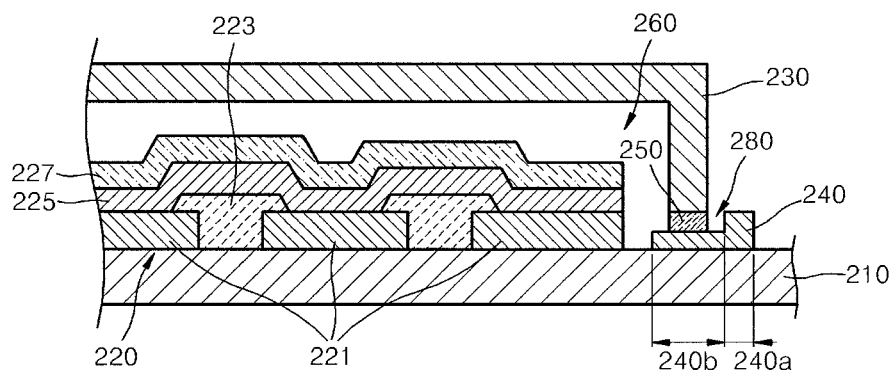

Next, as shown in FIG. 6D, the encapsulation substrate 230 and the device substrate 210 are assembled so that a portion of the encapsulation substrate 230 extending toward the device substrate 210 is located on the second portion 240b of the third electrode 240, the sealing member 250 is provided between the encapsulation substrate 230 and the device substrate 210 (in detail, between the encapsulation substrate 230 and the second portion 240b of the third electrode 240), and the encapsulation substrate 230 and the device substrate 210 are attached, as explained in detail with reference to FIG. 3D.

Next, the first layer 270 is formed in a space 280 formed between the sealing member 250 and the first portion 240a of the third electrode 240, thereby completely manufacturing the organic light-emitting apparatus of FIG. 5.

Figure 7:
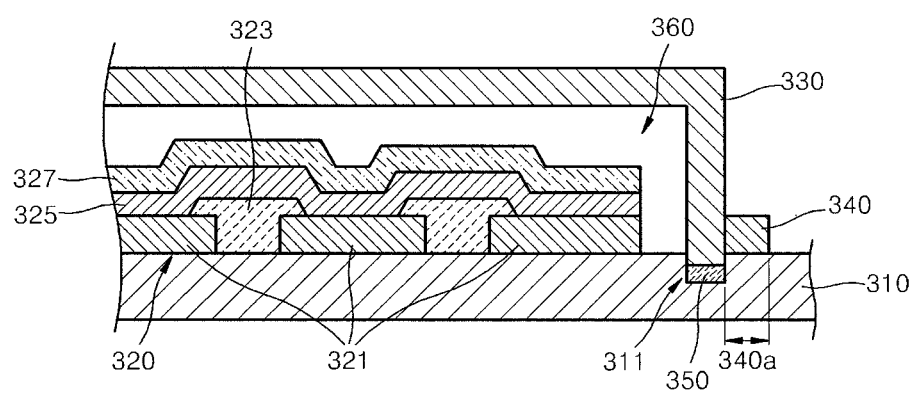
FIG. 7 is a cross-sectional view illustrating an organic light-emitting apparatus according to another embodiment.

FIG. 7 is a cross-sectional view illustrating an organic light-emitting apparatus according to another embodiment. The organic light-emitting apparatus of FIG. 7 includes a device substrate 310, an encapsulation substrate 330, a first electrode 321, an insulating layer 323, an organic layer 325, a second electrode 327, a sealing member 350, a third electrode 340 including a first portion 340a, and a hole 311. The first electrode 321, the insulating layer 323, the organic layer 325, and the second electrode 327 may constitute an organic light-emitting device 320. The organic light-emitting apparatus includes a space 360 between the device substrate 310 and the encapsulation substrate 330.

For information about the device substrate 310, the encapsulation substrate 330, the first electrode 321, the insulating layer 323, the organic layer 325, the second electrode 327, the sealing member 350, the first portion 340a, the third electrode 340, and the space 360 between the device substrate 310 and the encapsulation substrate 330 of the organic light-emitting apparatus of FIG. 7, the device substrate 10, the encapsulation substrate 30, the first electrode 21, the insulating layer 23, the organic layer 25, the second electrode 27, the sealing member 50, the first portion 40a, the third electrode 40 and the space 60 between the device substrate 10 and the encapsulation substrate 30 of the organic light-emitting apparatus of FIGS. 1A and 1B are referred to.

The device substrate 310 of the organic light-emitting apparatus of FIG. 7 includes the hole 311 corresponding to the sealing member 350. Accordingly, the sealing member 350 is formed in the hole 311. Accordingly, since the sealing member 350 may be prevented from being exposed to external air, oxygen and/or moisture permeation through a side surface of the sealing member 350 may be effectively prevented.

The organic light-emitting apparatus of FIG. 7 may be manufactured by preparing the device substrate 310 in which the hole 311 is already formed.

Although the organic light-emitting apparatus and the method of manufacturing the same according to the present embodiments has been explained with reference to FIGS. 1A through 7, various modifications may be made. For example, a side surface of the sealing member 250 and a side surface of the first portion 240a of the third electrode 240 of the organic light-emitting apparatus of FIG. 5 may contact each other, and the device substrate 10 of the organic light-emitting apparatus of FIG. 1 may further include a hole corresponding to the sealing member 50.

The organic light-emitting apparatus according to the present embodiments have a long lifetime because it may substantially prevent moisture and/or oxygen permeation.

What is claimed is:

1. An organic light-emitting apparatus comprising:
a device substrate comprising a light-emitting area and a non-emitting area;
an encapsulation substrate covering the light-emitting area;
a first electrode formed on the light-emitting area and disposed between the device substrate and the encapsulation substrate;
an organic layer disposed between the encapsulation substrate and the first electrode;
a second electrode disposed between the organic layer and the encapsulation substrate;
a sealing member surrounding the light-emitting area; and
a third electrode disposed on the non-emitting area outside the sealing member, comprising a first portion surrounding the sealing member and isolating it from the exterior of the organic light emitting apparatus, and comprising the same material as that of the first electrode.

2. The organic light-emitting apparatus of claim 1, wherein each of the first electrode and the third electrode comprises at least one of a metal and a conductive oxide.

3. The organic light-emitting apparatus of claim 1, wherein each of the first electrode and the third electrode comprises indium tin oxide (ITO).

4. The organic light-emitting apparatus of claim 1, wherein the sealing member comprises at least one of an adhesive and a glass frit.

5. The organic light-emitting apparatus of claim 1, wherein the sealing member comprises at least one of a silicon-based compound represented by Formula 1 and a cured product of the silicon-based compound:

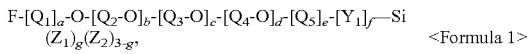
<Formula 1> wherein
$Q_1$ is a divalent group represented by —C($R_1$)($R_2$)—;
$Q_2$ is a divalent group represented by —C($R_3$)($R_4$)—C($R_5$)($R_6$)—C($R_7$)($R_8$)—;
$Q_3$ is a divalent group represented by —C($R_9$)($R_{10}$)—C($R_{11}$)($R_{12}$)—;
$Q_4$ is a divalent group represented by —C($R_{13}$)($R_{14}$)—;
$Q_5$ is a divalent group represented by —C($R_{15}$)($R_{16}$)—;
$R_1$ through $R_{16}$ are each independently selected from the group consisting of H, —F, —$CH_3$, —$CH_2F$, —$CHF_2$, and —$CF_3$;
$Y_1$ is a divalent organic group;
$Z_1$ is a $C_1$-$C_{30}$ alkyl group or a $C_1$-$C_{30}$ alkyl group that is substituted with at least one —F;
$Z_2$ is a $C_1$-$C_{30}$ alkoxy group or a $C_1$-$C_{30}$ alkoxy group that is substituted with at least one —F;
a and e are each independently an integer from 1 to 20;
b, c, and d are each independently an integer from 0 to 200, and wherein b, c, and d are not all 0;
f is an integer from 0 to 10; and
g is an integer from 0 to 3.

6. The organic light-emitting apparatus of claim 1, wherein the sealing member sequentially comprises a first sealing member layer, a second sealing member layer, and a third sealing member layer, wherein each of the first sealing member layer and the third sealing member layer comprises an adhesive, and the second sealing member layer comprises at least one of a silicon-based compound represented by Formula 1 and a cured product of the silicon-based compound;

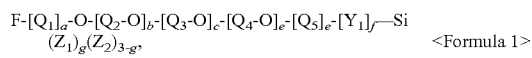
<Formula 1> wherein
$Q_1$ is a divalent group represented by —C($R_1$)($R_2$)—;
$Q_2$ is a divalent group represented by —C($R_3$)($R_4$)—C($R_5$)($R_6$)—C($R_7$)($R_8$)—;
$Q_3$ is a divalent group represented by —C($R_9$)($R_{10}$)—C($R_{11}$)($R_{12}$)—;
$Q_4$ is a divalent group represented by —C($R_{13}$)($R_{14}$)—;
$Q_5$ is a divalent group represented by —C($R_{15}$)($R_{16}$)—;
$R_1$ through $R_{16}$ are each independently H, —F, —$CH_3$, —$CH_2F$, —$CHF_2$, or —$CF_3$;
$Y_1$ is a divalent organic group;
$Z_1$ is a $C_1$-$C_{30}$ alkyl group or a $C_1$-$C_{30}$ alkyl group that is substituted with at least one —F;
$Z_2$ is a $C_1$-$C_{30}$ alkoxy group or a $C_1$-$C_{30}$ alkoxy group that is substituted with at least one —F;
a and e are each independently an integer from 1 to 20;
b, c, and d are each independently an integer from 0 to 200, and wherein b, c, and d are not all 0;
f is an integer from 0 to 10; and
g is an integer from 0 to 3.

7. The organic light-emitting apparatus of claim 1, wherein a side surface of the sealing member and a side surface of the first portion of the third electrode contact each other.

8. The organic light-emitting apparatus of claim 1, wherein when a maximum thickness of the first electrode is $L_1$ and a maximum thickness of the first portion of the third electrode is $L_2$, $L_1$=$L_2$.

9. The organic light-emitting apparatus of claim 1, wherein, when a maximum thickness of the first portion of the third electrode is $L_2$ and a maximum thickness of the sealing member is $L_3$, $L_2 \geq L_3$.

10. The organic light-emitting apparatus of claim 1, wherein a space between the device substrate and the encapsulation substrate is a vacuum space.

11. The organic light-emitting apparatus of claim 1, further comprising a moisture-absorbing layer disposed in a space between the device substrate and the encapsulation substrate.

12. The organic light-emitting apparatus of claim 1, wherein a filler fills a space between the device substrate and the encapsulation substrate.

13. The organic light-emitting apparatus of claim 12, wherein the filler comprises at least one of a silicon-based compound represented by Formula 1 and a cured product of the silicon-based compound:

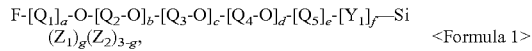
<Formula 1> wherein $Q_1$ is a divalent group represented by —C($R_1$)($R_2$)—;

$Q_2$ is a divalent group represented by —C($R_3$)($R_4$)—C($R_5$)($R_6$)—C($R_7$)($R_8$)—;

$Q_3$ is a divalent group represented by —C($R_9$)($R_{10}$)—C($R_{11}$)($R_{12}$)—;

$Q_4$ is a divalent group represented by —C($R_{13}$)($R_{14}$)—;

$Q_5$ is a divalent group represented by —C($R_{15}$)($R_{16}$)—;

$R_1$ through $R_{16}$ are each independently H, —F, —CH$_3$, —CH$_2$F, —CHF$_2$, or —CF$_3$;

$Y_1$ is a divalent organic group;

$Z_1$ is a $C_1$-$C_{30}$ alkyl group or a $C_1$-$C_{30}$ alkyl group that is substituted with at least one —F;

$Z_2$ is a $C_1$-$C_{30}$ alkoxy group or a $C_1$-$C_{30}$ alkoxy group that is substituted with at least one —F;

a and e are each independently an integer from 1 to 20;

b, c, and d are each independently an integer from 0 to 200, and wherein b, c, and d are not all 0;

f is an integer from 0 to 10; and g is an integer from 0 to 3.

14. The organic light-emitting apparatus of claim 1, wherein the sealing member and the first portion of the third electrode are spaced apart from each other, a space between the sealing member and the first portion of the third electrode is filled with a first layer, and the first layer comprises at least one of a silicon-based compound represented by Formula 1 and a cured product of the silicon-based compound:

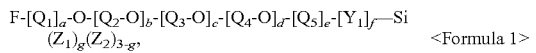

<Formula 1> wherein $Q_1$ is a divalent group represented by —C($R_1$)($R_2$)—;

$Q_2$ is a divalent group represented by —C($R_3$)($R_4$)—C($R_5$)($R_6$)—C($R_7$)($R_8$)—;

$Q_3$ is a divalent group represented by —C($R_9$)($R_{10}$)—C($R_{11}$)($R_{12}$)—;

$Q_4$ is a divalent group represented by —C($R_{13}$)($R_{14}$)—;

$Q_5$ is a divalent group represented by —C($R_{15}$)($R_{16}$)—;

$R_1$ through $R_{16}$ are each independently H, —F, —CH$_3$, —CH$_2$F, —CHF$_2$, or —CF$_3$;

$Y_1$ is a divalent organic group;

$Z_1$ is a $C_1$-$C_{30}$ alkyl group or a $C_1$-$C_{30}$ alkyl group that is substituted with at least one —F;

$Z_2$ is a $C_1$-$C_{30}$ alkoxy group or a $C_1$-$C_{30}$ alkoxy group that is substituted with at least one —F;

a and e are each independently an integer from 1 to 20;

b, c, and d are each independently an integer from 0 to 200, and wherein b, c, and d are not all 0;

f is an integer from 0 to 10; and g is an integer from 0 to 3.

15. The organic light-emitting apparatus of claim 14, wherein, when a maximum thickness of the sealing member is L3 and a maximum thickness of the first layer is L4, L3≤L4.

16. The organic light-emitting apparatus of claim 1, wherein the third electrode has a second portion extending from the first portion of the third electrode toward the sealing member, and the second portion of the third electrode is located between the sealing member and the device substrate.

17. The organic light-emitting apparatus of claim 16, wherein, when a maximum thickness of the first portion of the third electrode is L2 and a maximum thickness of the second portion of the third electrode is L5, L2≥L5.

18. The organic light-emitting apparatus of claim 16, wherein the sealing member and the first portion of the third electrode are spaced apart from each other, a space between the sealing member and the first portion of the third electrode is filled with a first layer, and the first layer comprises at least one of a silicon-based compound represented by Formula 1 and a cured product of the silicon-based compound:

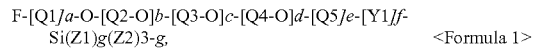

<Formula 1> wherein

Q1 is a divalent group represented by —C(R1)(R2)-;

Q2 is a divalent group represented by —C(R3)(R4)-C(R5)(R6)-C(R7)(R8)-;

Q3 is a divalent group represented by —C(R9)(R10)-C(R11)(R12)-;

Q4 is a divalent group represented by —C(R13)(R14)-;

Q5 is a divalent group represented by —C(R15)(R16)-;

R1 through R16 are each independently H, —F, —CH3, —CH2F, —CHF2, or —CF3;

Y1 is a divalent organic group;

Z1 is a C1-C30 alkyl group or a C1-C30 alkyl group that is substituted with at least one —F;

Z2 is a C1-C30 alkoxy group or a C1-C30 alkoxy group that is substituted with at least one —F;

a and e are each independently an integer from 1 to 20;

b, c, and d are each independently an integer from 0 to 200, and wherein b, c, and d are not all 0;

f is an integer from 0 to 10; and g is an integer from 0 to 3.

19. The organic light-emitting apparatus of claim 1, wherein the device substrate comprises a hole corresponding to the sealing member, and the sealing member is disposed in the hole.

20. A method of manufacturing an organic light-emitting apparatus, the method comprising:

preparing a device substrate comprising a light-emitting area and a non-emitting area;

forming a first electrode on the light-emitting area, and forming a third electrode comprising a first portion surrounding a sealing member and isolating it from the exterior of the organic light emitting apparatus and comprising the same material as that of the first electrode on the non-emitting area;

forming an organic layer on the first electrode;

forming a second electrode on the organic layer, and attaching the device substrate and an encapsulation substrate to each other by assembling the encapsulation substrate with the device substrate so that the encapsulation substrate covers the light-emitting area, and providing the sealing member to the non-emitting area inside the third electrode to surround the light-emitting area.

21. The method of claim 20, wherein each of the first electrode and the third electrode comprises at least one material selected from the group consisting of metals and conductive oxides.

22. The method of claim 20, wherein each of the first electrode and the third electrode comprises ITO.

23. The method of claim 20, wherein the providing of the sealing member of the attaching of the device substrate and the encapsulation substrate to each other comprises at least one of: providing an adhesive precursor between the device substrate and the encapsulation substrate and curing the adhesive precursor, providing a glass frit precursor between the device substrate and the encapsulation substrate and performing heat treatment, and providing a silicon-based compound represented by Formula 1 between the device substrate and the encapsulation substrate:

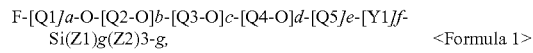

<Formula 1> wherein

Q1 is a divalent group represented by —C(R1)(R2)-;
Q2 is a divalent group represented by —C(R3)(R4)-C(R5)(R6)-C(R7)(R8)-;
Q3 is a divalent group represented by —C(R9)(R10)-C(R11)(R12)-;
Q4 is a divalent group represented by —C(R13)(R14)-;
Q5 is a divalent group represented by —C(R15)(R16)-;
R1 through R16 are each independently H, —F, —CH3, —CH2F, —CHF2, or —CF3;
Y1 is a divalent organic group;
Z1 is a C1-C30 alkyl group or a C1-C30 alkyl group that is substituted with at least one —F;
Z2 is a C1-C30 alkoxy group or a C1-C30 alkoxy group that is substituted with at least one —F;
a and e are each independently an integer from 1 to 20;
b, c, and d are each independently an integer from 0 to 200, and wherein b, c, and d are not all 0;
f is an integer from 0 to 10; and
g is an integer from 0 to 3.

24. The method of claim 20, further comprising at least one of creating a vacuum in a space between the device substrate and the encapsulation substrate, providing a moisture-absorbing layer to the space between the device substrate and the encapsulation substrate, and providing a filler to the space between the device substrate and the encapsulation substrate.

25. The method of claim 24, wherein the filler comprises at least one of a silicon-based compound represented by Formula 1 and a cured product of the silicon-based compound:

F-[Q1]a-O-[Q2-O]b-[Q3-O]c-[Q4-O]d-[Q5]e-[Y1]f-Si(Z1)g(Z2)3-g, <Formula 1> wherein

Q1 is a divalent group represented by —C(R1)(R2)-;
Q2 is a divalent group represented by —C(R3)(R4)-C(R5)(R6)-C(R7)(R8)-;
Q3 is a divalent group represented by —C(R9)(R10)-C(R11)(R12)-;
Q4 is a divalent group represented by —C(R13)(R14)-;
Q5 is a divalent group represented by —C(R15)(R16)-;
R1 through R16 are each independently H, —F, —CH3, —CH2F, —CHF2, or —CF3;
Y1 is a divalent organic group;
Z1 is a C1-C30 alkyl group or a C1-C30 alkyl group that is substituted with at least one —F;
Z2 is a C1-C30 alkoxy group or a C1-C30 alkoxy group that is substituted with at least one —F;
a and e are each independently an integer from 1 to 20;
b, c, and d are each independently an integer from 0 to 200, and wherein b, c, and d are all 0;
f is an integer from 0 to 10; and
g is an integer from 0 to 3.

26. The method of claim 20, further comprising, after the attaching of the device substrate and the encapsulation substrate to each other, providing a first layer comprising at least one of a silicon-based compound represented by Formula 1 and a cured product of the silicon-based compound to a space between the sealing member and the first portion of the third electrode:

F-[Q1]a-O-[Q2-O]b-[Q3-O]c-[Q4-O]d-[Q5]e-[Y1]f-Si(Z1)g(Z2)3-g, <Formula 1> wherein

Q1 is a divalent group represented by —C(R1)(R2)-;
Q2 is a divalent group represented by —C(R3)(R4)-C(R5)(R6)-C(R7)(R8)-;
Q3 is a divalent group represented by —C(R9)(R10)-C(R11)(R12)-;
Q4 is a divalent group represented by —C(R13)(R14)-;
Q5 is a divalent group represented by —C(R15)(R16)-;
R1 through R16 are each independently selected from the group consisting of H, —F, —CH3, —CH2F, —CHF2, and —CF3;
Y1 is a divalent organic group;
Z1 is a C1-C30 alkyl group or a C1-C30 alkyl group that is substituted with at least one —F;
Z2 is a C1-C30 alkoxy group or a C1-C30 alkoxy group that is substituted with at least one —F;
a and e are each independently an integer from 1 to 20;
b, c, and d are each independently an integer from 0 to 200, and wherein b, c, and d are not all 0;
f is an integer from 0 to 10; and
g is an integer from 0 to 3.

27. The method of claim 20, wherein the forming of the first electrode and the third electrode further comprises additionally forming a second portion extending from the first portion of the third electrode toward the sealing member.

28. The method of claim 20, wherein the providing of the device substrate comprising the light-emitting area and the non-emitting area further comprises forming a hole corresponding to the sealing member in the non-emitting area of the device substrate.

* * * * *